(12) United States Patent
Kamphuis et al.

(10) Patent No.: US 10,896,878 B2
(45) Date of Patent: Jan. 19, 2021

(54) INTEGRATED CIRCUIT SAW BOW BREAK POINT

(71) Applicant: NXP B.V., Eindhoven (NL)

(72) Inventors: Antonius Hendrikus Jozef Kamphuis, Lent (NL); Johannes Cobussen, Beuningen (NL); Christian Zenz, Graz (AT); Guido Albermann, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/444,322

(22) Filed: Jun. 18, 2019

(65) Prior Publication Data

US 2020/0402918 A1 Dec. 24, 2020

(51) Int. Cl.
| | |
|---|---|
| *H01L 23/544* | (2006.01) |
| *H01L 21/78* | (2006.01) |
| *H01L 23/58* | (2006.01) |
| *H01L 23/52* | (2006.01) |
| *H01L 21/66* | (2006.01) |
| *H01L 21/304* | (2006.01) |

(52) U.S. Cl.
CPC .......... *H01L 23/544* (2013.01); *H01L 21/304* (2013.01); *H01L 21/78* (2013.01); *H01L 22/32* (2013.01); *H01L 22/34* (2013.01); *H01L 23/52* (2013.01); *H01L 23/585* (2013.01)

(58) Field of Classification Search
CPC ....... H01L 23/544; H01L 21/78; H01L 23/52; H01L 21/304; H01L 22/32; H01L 23/585; H01L 22/34

USPC ........................................................ 257/620
See application file for complete search history.

(56) References Cited

U.S. PATENT DOCUMENTS

| | | | | |
|---|---|---|---|---|
| 5,530,280 A | * | 6/1996 | White | H01L 23/562 |
| | | | | 257/508 |
| 5,650,348 A | * | 7/1997 | Pasch | H01L 27/11898 |
| | | | | 438/460 |
| 6,214,703 B1 | * | 4/2001 | Chen | H01L 21/78 |
| | | | | 257/E21.599 |
| 6,365,958 B1 | * | 4/2002 | Ibnabdeljalil | H01L 23/562 |
| | | | | 257/619 |
| 6,410,936 B1 | * | 6/2002 | Hongo | G01R 31/2856 |
| | | | | 257/48 |
| 6,475,817 B2 | | 11/2002 | Bergler et al. | |
| 6,744,067 B1 | | 6/2004 | Farnworth et al. | |
| 7,161,175 B2 | * | 1/2007 | Shau | G01R 31/2856 |
| | | | | 257/48 |
| 7,329,899 B2 | | 2/2008 | Farnworth et al. | |

(Continued)

FOREIGN PATENT DOCUMENTS

| | | |
|---|---|---|
| DE | 4200586 A1 | 7/1993 |
| WO | WO 1998008257 B2 | 2/1998 |

*Primary Examiner* — Mohammad M Hoque
(74) *Attorney, Agent, or Firm* — Charlene R. Jacobsen

(57) ABSTRACT

A saw bow is provided and designed such that the conductors of the saw bow will break at a predictable location when using modern dicing techniques. This results in a break in the circuit provided by the saw bow, with any exposed conductors not being on the die side. Further, by providing a known breaking point in the saw bow, modern dicing techniques such as plasma dicing can be used, thereby allowing for the saw lane to be made narrower, which will in turn increase the number of wafers that can be included on a wafer.

15 Claims, 6 Drawing Sheets

(56) References Cited

U.S. PATENT DOCUMENTS

| | | | | |
|---|---|---|---|---|
| 8,065,792 B2* | 11/2011 | Chia | ............... | H01L 22/00 |
| | | | | 29/831 |
| 8,519,512 B2* | 8/2013 | Tsai | ............... | H01L 21/78 |
| | | | | 257/620 |
| 8,633,552 B1* | 1/2014 | Wissman | ............ | H03H 3/0072 |
| | | | | 257/415 |
| 8,952,497 B2* | 2/2015 | Chen | ............... | H01L 27/1464 |
| | | | | 257/620 |
| 8,987,867 B2* | 3/2015 | Lee | ............... | H01L 27/0207 |
| | | | | 257/620 |
| 9,252,063 B2 | 2/2016 | Khoo et al. | | |
| 9,508,774 B2* | 11/2016 | Iizuka | ............... | H01L 27/14601 |
| 9,856,140 B2* | 1/2018 | Huygens | ............... | B41J 2/1632 |
| 2008/0001259 A1* | 1/2008 | Scheucher | ............ | H01L 23/585 |
| | | | | 257/620 |
| 2010/0148314 A1* | 6/2010 | Han | ............... | H01L 22/34 |
| | | | | 257/620 |
| 2010/0320612 A1 | 12/2010 | Uchida et al. | | |
| 2012/0112308 A1* | 5/2012 | Matsuda | ............ | H01L 29/42376 |
| | | | | 257/503 |
| 2013/0026466 A1* | 1/2013 | Pagani | ............... | H01L 22/32 |
| | | | | 257/48 |
| 2015/0200146 A1* | 7/2015 | Reber | ............... | H01L 22/34 |
| | | | | 257/506 |
| 2016/0064294 A1* | 3/2016 | Reber | ............... | H01L 23/522 |
| | | | | 257/499 |
| 2019/0035750 A1* | 1/2019 | Han | ............... | H01L 21/78 |
| 2019/0181063 A1* | 6/2019 | Liao | ............... | H01L 23/544 |

\* cited by examiner

INTEGRATED CIRCUIT SAW BOW BREAK POINT

BACKGROUND

Field

This disclosure relates generally to integrated circuit manufacturing, and more specifically, to modifying integrated circuit die saw bows for consistent breakage location during singulation.

Related Art

Wafer testing is a step performed during semiconductor device fabrication.

During this step, which is performed before a wafer is sent to die preparation, individual integrated circuits on the wafer are tested for functional defects by applying special test patterns to them. Wafer testing is often performed by a piece of test equipment called a wafer prober. During wafer testing, probes are applied to contacts on each die on the wafer to communicate with the circuitry within the die. Test patterns can be provided to the circuitry and responses registered by the probes. The wafer prober can also exercise any test circuitry present on wafer scribe lines.

Once testing is completed, the individual device die are separated from the wafer (and neighboring device die) during a singulation process. Historically, device die were singulated from the wafer using a saw that cut through scribe lines between the die on the wafer. As device die sizes have become smaller and smaller and the number of die on a wafer have increased, wafer singulation techniques have moved to stealth dicing and plasma dicing to allow for smaller scribe lines. These techniques do not involve sawing the die for singulation, but instead provide regions where the die can be broken apart along the scribe line.

Wafer testing can involve the use of test contact pads on the device die. Test pads can be configured to be disabled after the testing process. Commonly, a circuit path external to the device die is provided to connect circuitry within the device die to the test pad. The external circuit path, called a saw bow, loops through the scribe line region and is designed to be cut during singulation, thereby disabling test pad access to the test circuitry. Other uses for a saw bow can include connecting internal circuitry within the device die for programming purposes during the test and configuration phase while still on a wafer but disabling that functionality after singulation.

In order for internal circuitry within a die to remain secure after singulation, a clean break of the saw bow connection must be ensured. While sawing device die apart does guarantee a clean cut through the saw bow, the newer techniques of stealth dicing and plasma dicing cannot guarantee a clean break without potentially exposing some of the circuit path. This can result in a region where the saw bow path can short together, thereby defeating the purpose of severing the saw bow path or providing a potential contact path for illicit communication to the circuitry within the die.

It is therefore desirable to provide a saw bow conductive path that can predictably break in an area that will result in no exposed conductors at the die side when using modern techniques for device die singulation.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Figure 1:
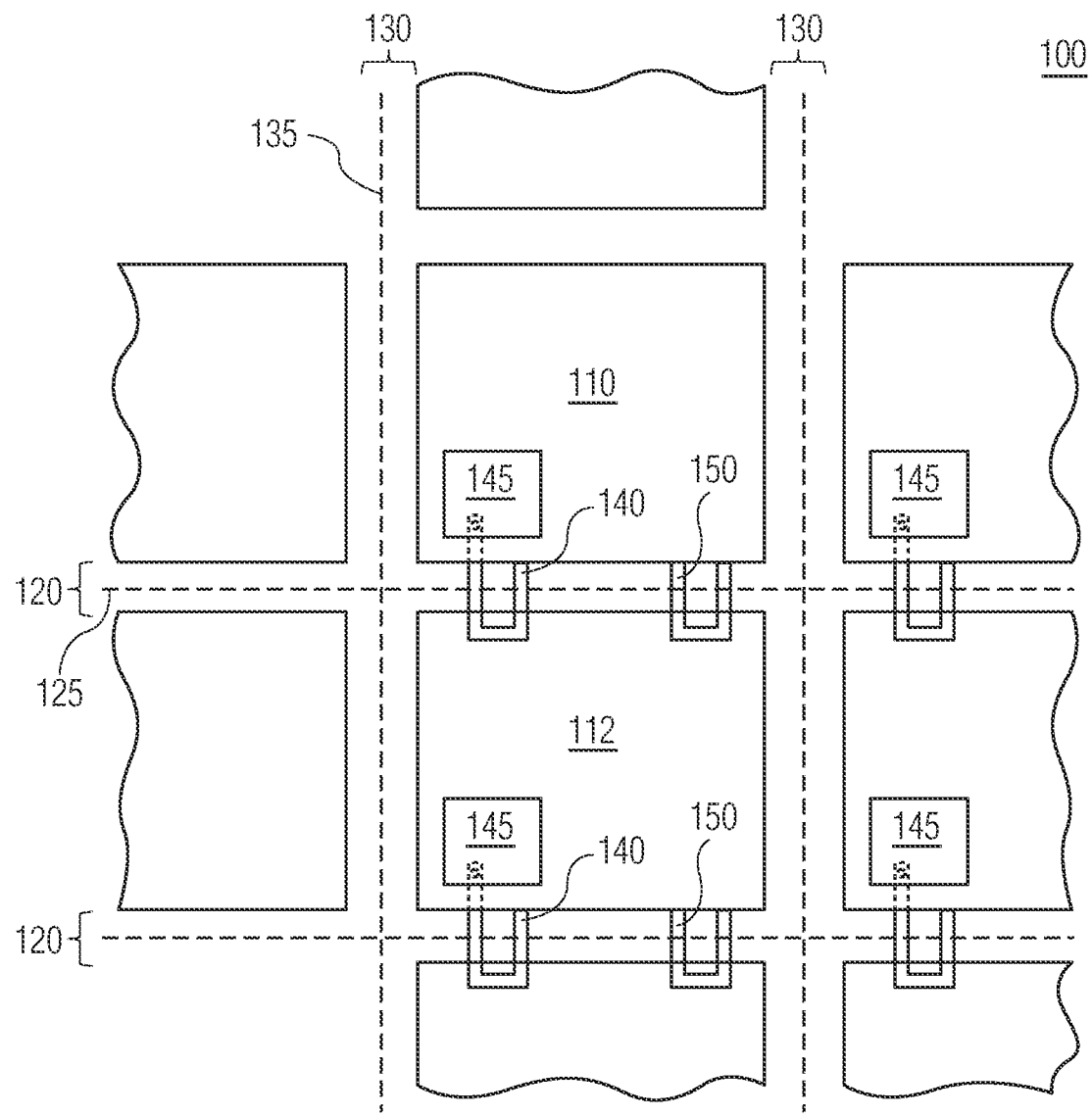
FIG. 1 is a simplified block diagram illustrating a portion of a semiconductor wafer with individual integrated circuit dies formed thereon.

Embodiments of the present invention provide a saw bow designed such that the conductors of the saw bow will break at a predictable location when using modern dicing techniques. This results in a break in the circuit provided by the saw bow, with any exposed conductors not being on the die side. Further, by providing a known breaking point in the saw bow, modern dicing techniques such as plasma dicing can be used, thereby allowing for the saw lane to be made narrower, which will in turn increase the number of dies that can be included on a wafer.

Traditionally, an integrated circuit saw bow is sawed through after wafer testing, so that an end customer cannot access the electronic content of the die or that the die can be placed in a non-testing mode. New die separation techniques, such as stealth dicing and plasma dicing, do not use a sawing process and therefore saw bow metal is broken during die singulation. The location of a break in the saw bow metal is less predictable than sawing and has the potential to cause shorting in a singulated die due to exposed metal on the die side. Shorting can be caused by, for example, anisotropic conductive paste (ACP), which is composed of particles that can lay across exposed conductors of a severed saw bow.

In some saw bow applications, the shorting problem was overcome by expanding spacing between the legs of a saw bow conductive path exiting from a device die from 2 μm to 20 μm. But as die size gets smaller, providing a large enough gap between the legs of a saw bow becomes dimensionally very difficult, if not impossible, and can be expensive in terms of area dedication.

As mentioned above, one technique for dicing silicon wafers is a laser-based technique called stealth dicing. Stealth dicing is a two-stage process in which defect regions are introduced into the wafer by scanning a laser beam along intended cutting lines and secondly a carrier membrane underlying the wafer is expanded to cause the wafer to fracture along the cutting lines. The first step involves using a laser having a wavelength adapted to the electronic bandgap of silicon, where maximum absorption of the laser is adjusted through the use of optical focusing. That is, the laser beam is optically focused onto a point inside the semiconductor wafer. Defect regions of about 10 µm width are inscribed along the intended dicing lines, where the beam can be focused at different depths of the wafer. A fracture is induced along the 10 µm defect region by radially expanding the carrier membrane to which the wafer is attached. Cleavage along the defect region initiates at the bottom of the wafer and advances to the surface. Due to the 10 µm defect region, however, stealth dicing becomes more difficult for smaller sized dies using smaller width dicing lanes.

Plasma dicing employs deep silicon etch technology to singulate dies from wafers. The technology provides high quality results, design flexibility, and dices the entire wafer at the same time without die size sensitivity. Plasma dicing can employ a dry etch process in which areas of a wafer left unmasked are attacked by a plasma. Process gases are used to etch exposed dicing lane material and to control the vertical profile of the cut in the dicing lane. Plasma dicing can be performed to partially or completely remove all exposed silicon in the dicing lane. An advantage of the plasma dicing process over a stealth dicing process is that for certain techniques a width of the cut can be as small as 4 µm, as compared to 10 µm for stealth dicing.

One drawback of a plasma dicing process is that the speed of a plasma etch process is limited by the smallest regions within which etching is performed. Thus, a small region between saw bow "leg" conductors can slow down the entire dicing process. While a wider gap in the saw bow loop serves to alleviate this issue, there are negatives with providing a large gap between saw bow legs, as discussed above. Embodiments of the present invention reduce the gap in the saw bow loop to the point that no etching is performed within the loop, thereby eliminating the small region limitation.

By not etching within the saw bow loop, a region that includes dicing lane material and saw bow conductors will be mechanically broken during the die singulation process. Embodiments of the present invention provide a technique for shaping the metal conductors of the saw bow so that the conductors break in a predictable location in order to avoid shorting or otherwise providing access to device die electronics through the saw bow path.

FIG. 1 is a simplified block diagram illustrating a portion of a semiconductor wafer 100 with individual integrated circuit dies formed thereon. In current technology, wafer diameters of 150 mm, 200 mm, and 300 mm are common. Semiconductor wafers of these dimensions can be processed to include hundreds to thousands of possible die per wafer (PDPW), depending upon the nature the circuitry provided by the semiconductor device die and the nature of the processing technology used in manufacturing the semiconductor devices. The semiconductor wafer comprises a semiconductor substrate that can be any semiconductor material or combinations of materials, such as gallium arsenide, silicon germanium, silicon-on-insulator (SOI), silicon, monocrystalline silicon, the like, and combinations of the above.

FIG. 1 illustrates a repeating set of semiconductor device die 110. During processing, dicing lanes (120, 130) are provided between each formed semiconductor device die. Upon completion of the integrated circuits in the dies, and testing thereof, the individual dies are singulated from the semiconductor wafer and each other die. Singulation processes, such as those described above, are performed along saw lines 125 and 135 in dicing lanes 120 and 130, respectively.

Die 110 include examples of saw bows extending across the dicing lanes. Saw bow 140 electrically couples circuitry within device die 110 to a test pad 145 located on a surface of device die 110. During device test, a probe can be brought into contact with test pad 145, for example, to provide testing signals to integrated circuits within device die 110, to read information from those integrated circuits, or to provide instructions or data to a memory within device die 110. Test pad 145 can be formed using metallization techniques known in the art, such as sputtering and photolithography. Saw bow 150 can be used to electrically couple integrated circuits within device die 110 for testing purposes (e.g., mode select for test). The electrical paths of both saw bow 140 and 150 are designed to be severed during singulation of device dies 110 from wafer 100.

Saw bows 140 and 150 are extensions of a metal layer formed within device die 110, which can be formed through a combination of deposition and patterning techniques, as known in the art. The metal layer can include any conductive material, such as, but not limited to aluminum, aluminum-tin, copper, platinum, palladium, iridium, tantalum, titanium, tungsten, or any metal alloy, nitride or silicide thereof. The saw bows extend from a first device die region (e.g., 110), across the dicing lane (e.g., 120), and into the seal ring (not shown) of a neighboring device die region (e.g., 112). Seal rings are stress protection structures around integrated circuits and protect the internal circuit inside semiconductor chips from damage caused by the sawing of the semiconductor chips from wafers. Typical seal rings are usually formed of interconnected metal layers, dielectric layers between the metal layers, and connecting vias electrically coupling the metal layers.

Figure 2A:
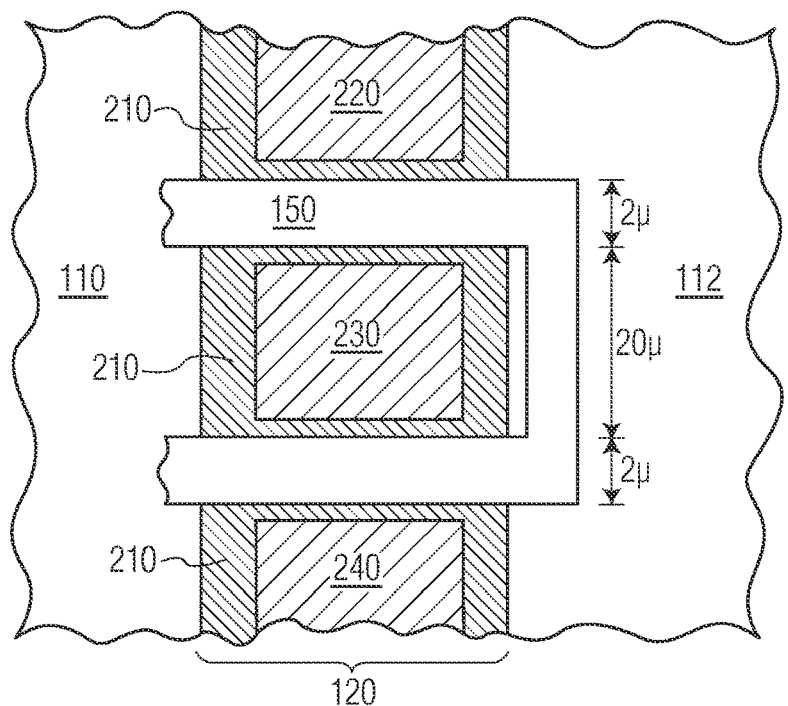
FIGS. 2A, 2B, and 2C illustrate a saw bow construction and severing process using plasma dicing of prior art structures.
Figure 2B:
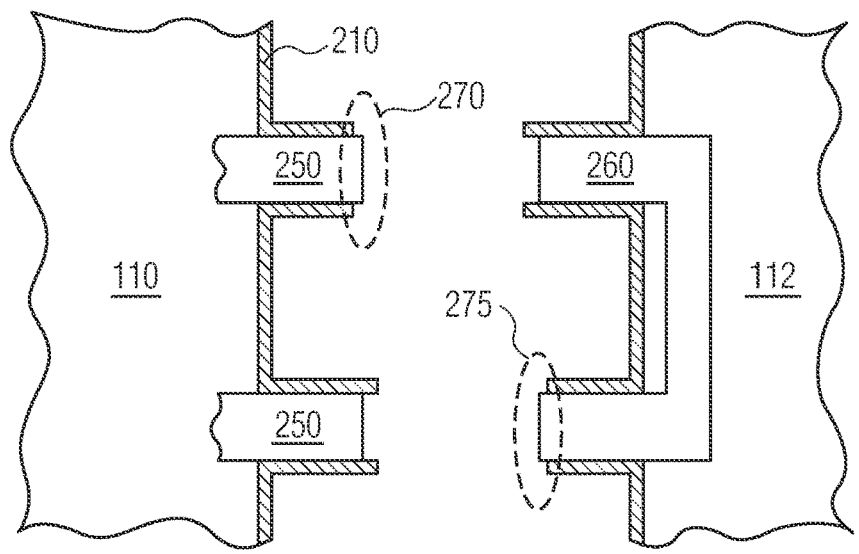
Figure 2C:
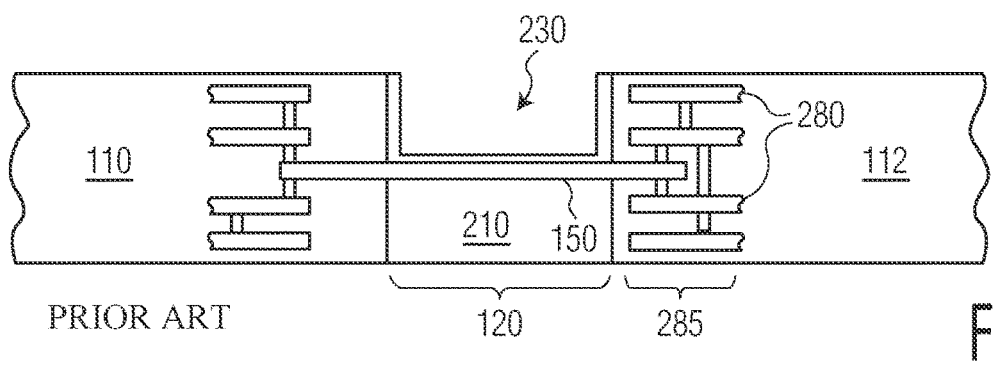

FIGS. 2A, 2B, and 2C illustrate concerns with a saw bow severing process using plasma dicing for prior art structures. As illustrated in FIG. 1, device die 110 has a saw bow 150 extending from a side of the device die through a dicing lane 120 and into device die region 112. Dicing lane 120 can include a dicing lane material 210 that includes wafer substrate material, such as silicon or germanium. Saw bow 150 has conductive legs of a width of 2 µm extending across dicing lane 120 to a loop conductor that is 20 µm long, resulting in a 20 µm space between the conductive legs. With such a loop structure, plasma etching for the dicing process occurs in dicing lane areas 220, 230, and 240. During the etching process, the dicing lane material is removed from dicing lane areas 220, 230, and 240. As discussed above, as the space between the conductive legs is reduced, a time to conduct the etching process for area 230 will increase. Thus, a spacing is chosen to optimize an amount of time to perform the etching process for the plasma dicing.

FIG. 2B illustrates results of the plasma dicing after singulation of die 110 from wafer 100. As illustrated, a small amount of dicing lane material 210 remains on the surface of device die 110 facing the region where dicing lane 120 was located, as well as on surfaces of the severed saw bow. Saw bow 150 is severed into die-side pieces 250 and loop-side piece 260. As discussed above, singulating device die 110 using a plasma dicing process requires breaking apart the metal in the saw bow because that material is not etched. The breaking of the metal can result in exposed areas of metal 270 and 275. Breakage can occur unpredictably on either the die side or the loop side. Avoiding electrical shorts between exposed metal on the die side is one reason why a large space of 20 µm is provided between the legs of saw bow 150. But as discussed above, with smaller die sizes a 20 µm space can be impractical.

FIG. 2C is a cross section of the saw bow region of the dicing lane after the etching process of the plasma dicing. As illustrated, saw bow 150 is an extension of one of the metal layers of die 110. The saw bow extends across dicing lane 120 and into device die region 112. Saw bow 150 extends into the seal ring region 285 of device die region 112, incorporating metal layers 280. In area 230, the etching process has removed the silicon material of the dicing lane to the metal of the saw bow conductor. In addition, as illustrated in FIG. 2B, the dicing lane material is etched beyond the metal layer within the saw bow loop.

Figure 3A:
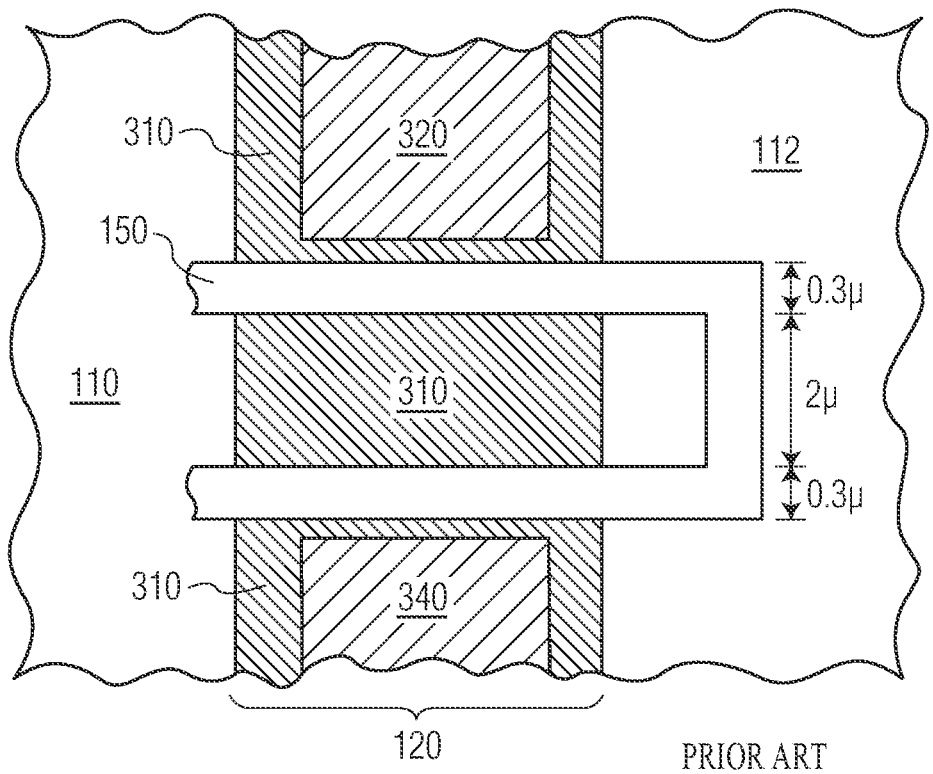
FIGS. 3A and 3B illustrate an additional saw bow construction and severing process using plasma dicing for smaller saw bow dimensions.
Figure 3B:
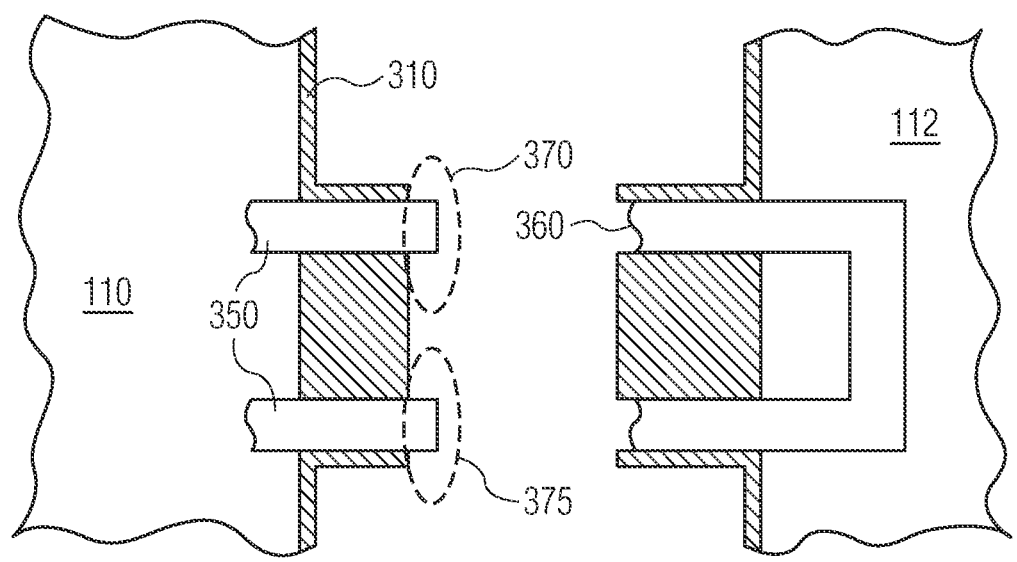

FIGS. 3A and 3B illustrate additional concerns with a saw bow severing process using plasma dicing for smaller saw bow dimensions. As illustrated in FIG. 2A, device die 110 has a saw bow 150 extending from a side of the device die through a dicing lane 120 and into device die region 112. Saw bow 150 has conductive legs of a width of 0.3 µm extending across dicing lane 120 to a loop conductor that is 2 µm long, resulting in a 2 µm space between the conductive legs. With such a loop structure, plasma etching for the dicing process occurs in dicing lane areas 320 and 340. During the etching process, the dicing lane material is not removed from a dicing lane area within the saw bow because this dimension is too small for efficient etching.

FIG. 3B illustrates results of the plasma dicing after singulation of die 110 from wafer 100. A small amount of dicing lane material 310 remains on the surface of device die 110 facing the region where dicing lane 120 was located, as well as on surfaces of the severed saw bow and the interior area of the remnants of the saw bow. Saw bow 150 is severed into die-side pieces 350 and loop-side piece 360. Again, singulating device die 110 requires breaking apart the metal in the saw bow because that material is not etched and also the dicing lane material within the saw bow region. This breaking can result in exposed areas of metal 370 and 375. While breakage can occur unpredictably on either the die side or the loop side, FIG. 3B illustrates breakage occurring on the die side The narrow gap between the saw bow die-side pieces 350 can result in an electrical short (e.g., by conductive dust released by the singulation process) and thereby defeating the purpose of the saw bow. Embodiments of the present invention provide a saw bow that will not sever with exposed metal on the die side, thereby avoiding the shorting problem.

Figure 4A:
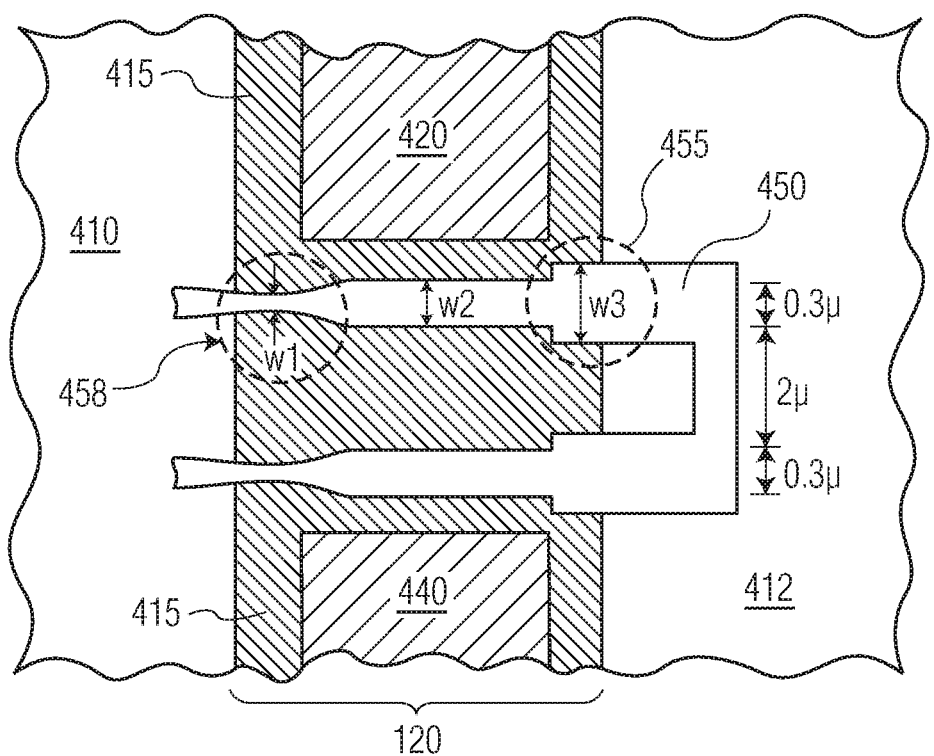
FIGS. 4A and 4B illustrate a saw bow configured to predictably break to expose metal on the loop side of the bow subsequent to plasma etching, in accord with one embodiment of the present invention.
Figure 4B:
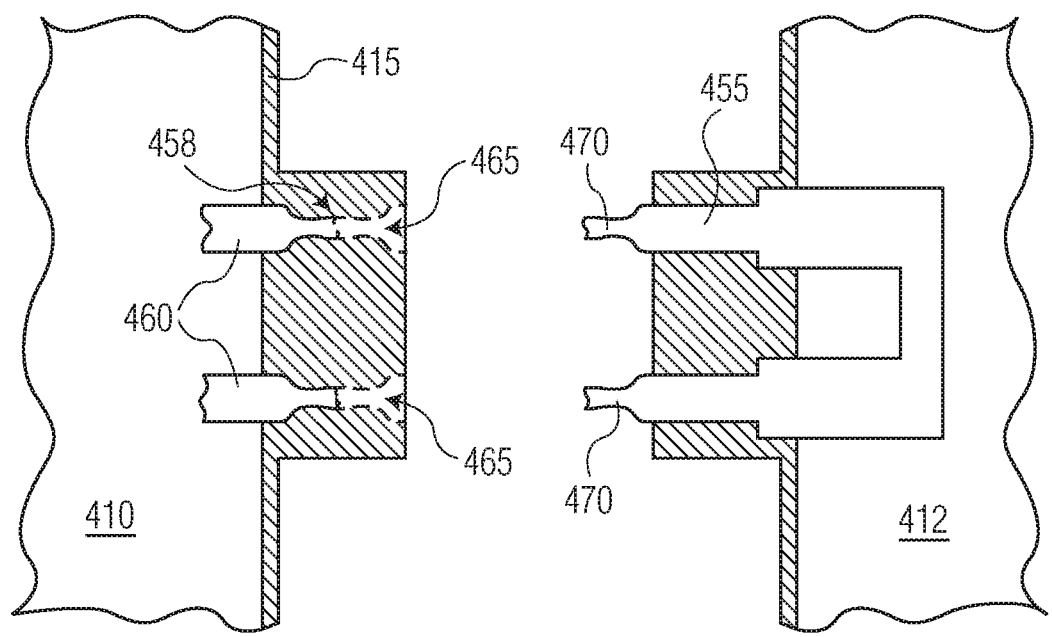

FIGS. 4A and 4B illustrate a saw bow configured to predictably break to expose metal on the loop side of the bow subsequent to plasma etching, in accord with one embodiment of the present invention. A device die 410 has a saw bow 450 extending from a side of the device die through a dicing lane 120 and into a neighboring device die area 412. Saw bow 450 has conductive legs extending across dicing lane 120 to a loop conductor that is 2 µm long. As with FIG. 3A, plasma etching for the dicing process occurs in dicing lane areas 420 and 440, but not between the conductive legs of the saw bow.

Each conductive leg of saw bow 450 is configured to be wider toward the loop end of the saw bow (e.g., region 455) with width W3 and narrower toward the device die end of the saw bow (e.g., region 458) having width W1. Widening the saw bow conductor in area 455 increases the tensile strength of the saw bow in that region, while narrowing the saw bow conductor in area 458 decreases the tensile strength of the saw bow metal in that region. Therefore, the widening of the saw bow metal toward the loop end of the saw bow makes the saw bow less likely to break at that end during mechanical separation after plasma dicing. Likewise, the narrowing of the saw bow metal toward the die end of the saw bow makes the saw bow more likely to break at that end during mechanical separation. Embodiments are not restricted to regions 455 and 458 having either curved or straight sides, as long as the narrowest width region (W1) is where breakage of the saw bow upon singulation is targeted. A region between regions 455 and 458 has a width W2 that is between that of W1 and W3. As with FIG. 3A, in one embodiment, the width of the saw bow legs is approximately 0.3 µm in the region between regions 455 and 458.

FIG. 4B illustrates results of plasma dicing after singulation of die 410 from a wafer. As above, small amount of dicing lane material 415 remains on the surface of device die 410 facing the region where dicing lane 120 was located, as well as on surfaces of the severed saw bow and the interior area of the remnants of the saw bow. Saw bow 450 is severed into die-side pieces 460 and loop-side piece 455. Again, singulating device die 410 requires breaking apart the metal in the saw bow because that material is not etched and also the dicing lane material within the saw bow region. As discussed above, saw bow 450 is configured to break in the region where the metal is narrowed 458 (i.e., where the tensile strength is lowest). The severed saw bow leaves exposed metal 470 on the loop side, while the die-side pieces of saw bow 460 are hidden by holes in dicing lane material 415 on that side. Since the die-side pieces of saw bow 460 are covered by the dicing lane material, the likelihood of a short between these two pieces is much less likely than the result of FIG. 3B.

Figure 5A:
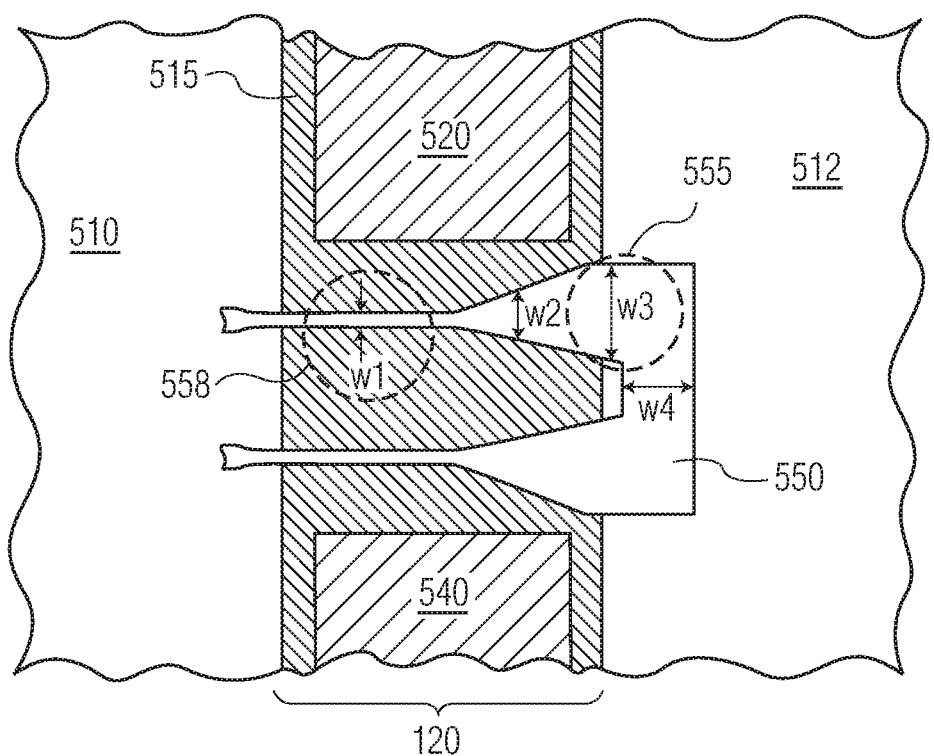
FIGS. 5A and 5B illustrate another saw bow configuration designed to predictably break to expose metal on the loop side of the saw bow subsequent to plasma etching, in accord with one embodiment of the present invention.
Figure 5B:
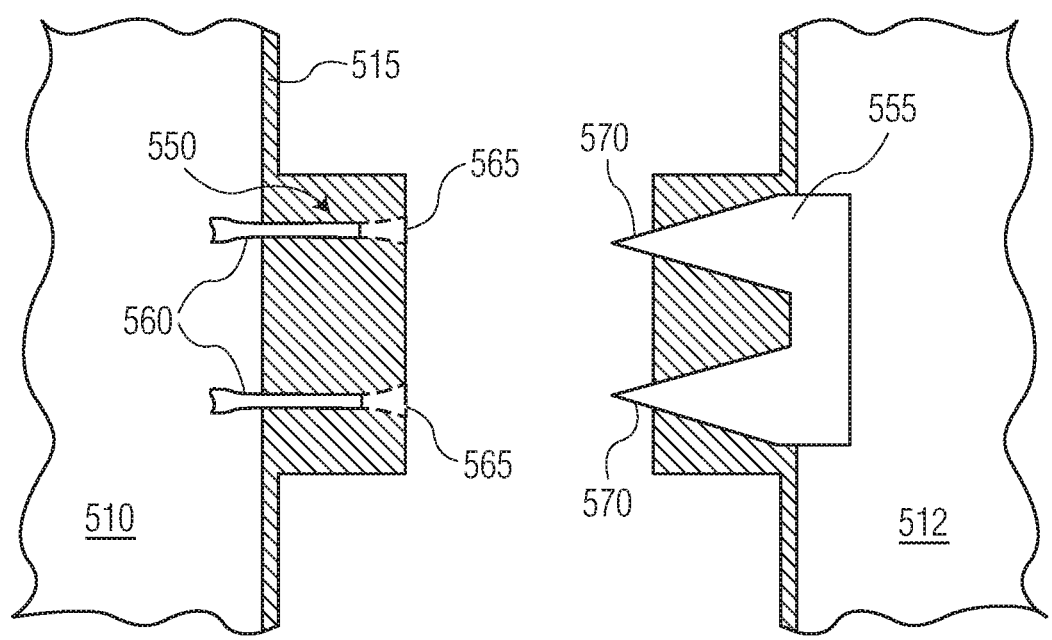

FIGS. 5A and 5B illustrate another saw bow configuration designed to predictably break to expose metal on the loop side of the saw bow subsequent to plasma etching, in accord with one embodiment of the present invention. Device die 510 has a saw bow 550 extending from a side of the device through dicing lane 120 and into neighboring device die area 512. Saw bow 550 has conductive legs extending across dicing lane 122 a loop conductor that is 2 µm long from the middle of the two conductive legs. As with FIG. 4A, plasma etching for the dicing process occurs in dicing lane areas 520 and 540, but not between the conductive legs of the saw bow.

As with FIG. 5A, each conductive leg of saw bow 550 is configured to be wider toward the loop end of the saw bow (e.g., region 555) having a width of W3 and narrower toward the device die end of the saw bow (e.g., region 558) having a width W1. Saw bow 550 is also configured to be stronger at the loop side (in and near device die area 512), providing a larger amount of metal material in area 555 to help ensure that no metal remains exposed on the die side. FIG. 5A further illustrates that embodiments of the present invention are not limited to a particular shape of the thickened or thinned metal, but instead can be adapted to appropriate designs to take advantage of varying tensile strength of the material in accord with a particular application. In the illustrated embodiment, a width W2 of a conductive leg increases linearly in region 555 from width W1 to width W3, forming an isosceles triangle shape in region 555. But embodiments are not limited to a linear increase in conductor width in this region, and can be shaped, for example, as a curve. Further, a width W4 of the loop end of the saw bow can be as thin as W1 or larger than W3.

FIG. 5B illustrates results of plasma dicing after singulation of die 510 from a wafer. Again, a small amount of dicing lane material 515 remains on the surface of device die 510 facing the region where dicing lane 120 was located, as well as on surfaces of the severed saw bow and the interior area of the remnants of the saw bow. Saw bow 550 is severed into die-side pieces 560 and loop side piece 555. Saw bow 550 is targeted to break in the region where the metal is narrowest (e.g. region 558 with width W1). The severed saw bow leaves some exposed metal 570 on the loop side, while the die-side pieces of saw bow 460 are hidden by holes in dicing lane material 515 on that side. As with FIG. 4B, the die-side pieces of saw bow are covered by the dicing lane material and therefore there is a low likelihood of a short between saw bow pieces 560.

Figure 6A:
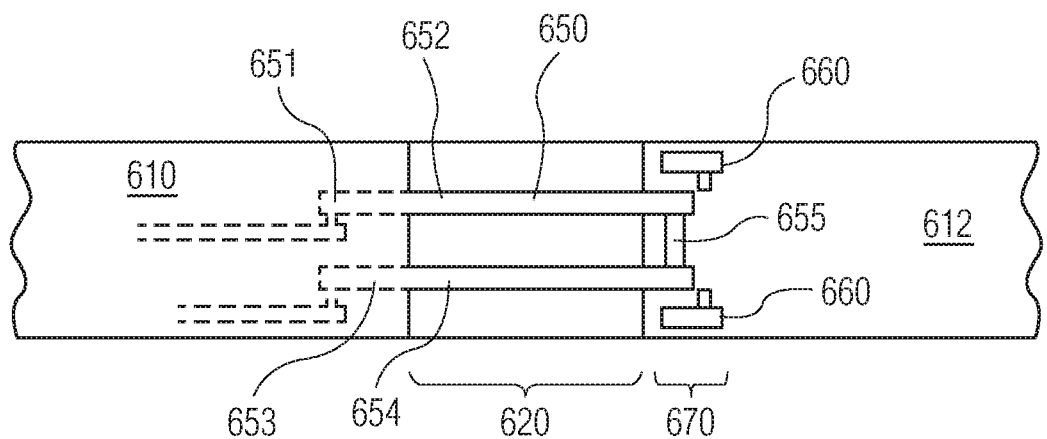
FIGS. 6A and 6B illustrates vertical saw bow configuration designed to predictably break to expose metal on the loop side of the saw bow subsequent to plasma etching, in accord with one embodiment of the present invention.
Figure 6B:
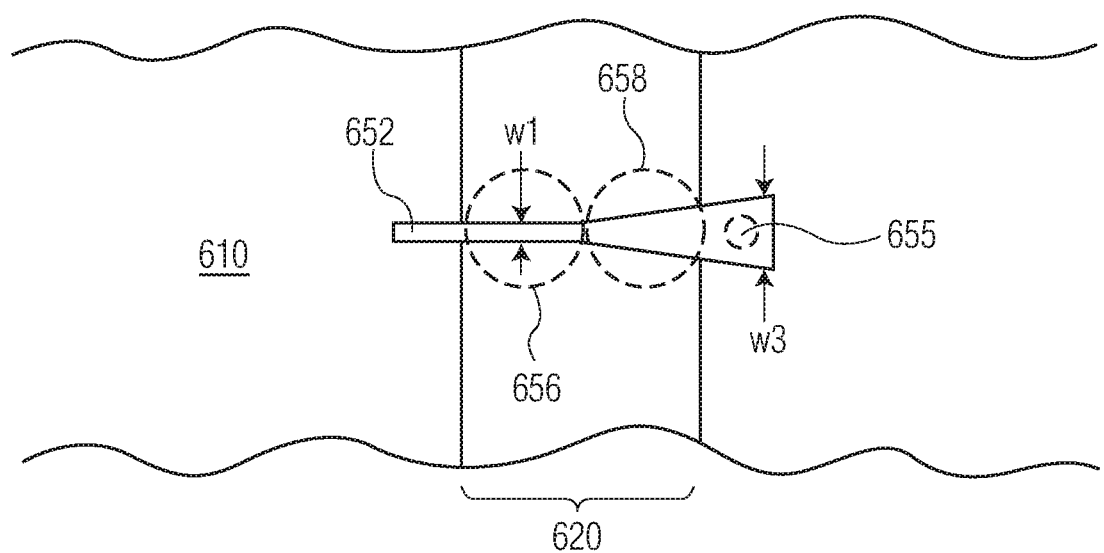

FIGS. 6A and 6B illustrates vertical saw bow configuration designed to predictably break to expose metal on the loop side of the saw bow subsequent to plasma etching, in accord with an embodiment of the present invention. FIG. 6A provides a cross section of a dicing lane 620 adjacent to a die 610 and a die 612. Saw bow 650 is vertically constructed in the dicing lane to electrically couple circuit paths in two metal layers 651 and 653. Saw bow legs 652 and 654 are extensions of die metal layers 651 and 653, respectively. Saw bow loop side is constructed to electrically couple the two saw bow legs through the use of a via 655, for example. This coupling occurs within a seal ring region 670 of die 612. FIG. 6B illustrates the plan view of the vertical saw bow, where only the top saw bow leg is visible. The top saw bow leg has a narrow region 656 having a width W1 and a wider region 658 having a maximum width W3 similar to that illustrated for FIG. 5A, with an increasing width W2 in region 658. As with the previously discussed saw bow embodiments of the present invention, saw bow 650 is configured to break along the narrower, die side of the saw bow, leaving potentially exposed metal on the loop side.

By now it should be appreciated that there has been provided a semiconductor wafer having a plurality of semiconductor device die arranged in a grid pattern. The semiconductor wafer includes a first semiconductor device die and a second semiconductor device die that neighbors the first semiconductor device die in the grid pattern and is separated from the first semiconductor device die by a dicing lane. The first semiconductor device die includes one or more metal layers. A metal layer of the one or more metal layers includes a first conductor extending from a side of the first semiconductor device die into the dicing lane and extending toward the second semiconductor device die, entering the second semiconductor device die, and ending in or near a seal ring of the second semiconductor device die. The first conductor is formed such that a first region of the first conductor located nearer to the first semiconductor device die in the dicing lane has a lower tensile strength than a second region of the first conductor located nearer to the second semiconductor device die.

In one aspect of the above embodiment, the semiconductor wafer further provides: the metal layer including a second conductor extending from the side of the first semiconductor device die into the dicing lane and extending toward the second semiconductor device die, entering the second semiconductor device die, and ending in or near the seal ring of the second semiconductor device die; the second conductor is formed such that a first region of the second conductor located nearer to the first semiconductor device die has a lower tensile strength than a second region of the second conductor located nearer to the second semiconductor device die; the second conductor is approximately parallel to the first conductor and about a same length from the first semiconductor device die as the first conductor; and, the metal layer further includes a third conductor that electrically couples the first conductor to the second conductor at the ends of the first and second conductors in the second semiconductor device die. In a further aspect, a distance between the first conductor and the second conductor is about 2 μm.

In another aspect of the above embodiment, the semiconductor wafer further provides: the first semiconductor device die including another metal layer of the one or more metal layers; the other metal layer includes a second conductor extending from the side of the first semiconductor device die into the dicing lane and extending toward the second semiconductor device die, entering the second semiconductor device die, and ending in or near the seal ring of the second semiconductor device die; the second conductor is formed such that a first region of the second conductor located nearer to the first semiconductor device die has a lower tensile strength than a second region of the second conductor located nearer to the second semiconductor device die; the second conductor is approximately parallel to the first conductor and about a same length from the first semiconductor device die as the first conductor; the second conductor is located above the first conductor; and, a third conductor electrically couples the first conductor to the second conductor at the end of the first and second conductors in the second semiconductor device die. In a further aspect the third conductor is a metal-filled via.

In another aspect of the above embodiment, the first conductor is formed such that the first region of the first conductor has a lower tensile strength than the second region of the first conductor by virtue of the first conductor having a narrower width in the first region than the second region. In a further aspect, the first conductor includes a third region between the first and second regions, the third region has a width of approximately 0.3 μm, and the first region has a width of 85% or less than that of the third region. In still a further aspect, the second region has a width greater than 0.3 μm. In yet another aspect of the above embodiment, the first conductor is formed such that the first region of the first conductor has a lower tensile strength than the second region of the first conductor by virtue of the second region of the first conductor including an approximate shape of an isosceles triangle, a base of the isosceles triangle is the end of the first conductor nearer to the second semiconductor device die, the base of the isosceles triangle is approximately three times a width of the first conductor in the first region, and a tip of the isosceles triangle is subsumed within the first conductor toward the first region.

A method of providing a saw bow to a semiconductor device die on a wafer is provided by another embodiment of the present invention. The method includes forming a first semiconductor device die that has one or more metal layers, forming a second semiconductor device die neighboring the first semiconductor device die in a grid pattern where the second semiconductor device die is separated from the first semiconductor device die by a dicing lane, forming a first conductor extending from a side of the first semiconductor device die into the dicing lane and toward the second semiconductor device die where the first conductor includes a first region located nearer to the first semiconductor device die and a second region located nearer to the second semiconductor device die, and forming the first conductor such that the first conductor includes a lower tensile strength in the first region than the second region. The first conductor is coupled to a metal layer of the one or more metal layers. The first conductor ends in or near a seal ring of the second semiconductor device die.

In one aspect of the above embodiment, the method further includes forming a second conductor extending from a side of the first semiconductor device die into the dicing lane and toward the second semiconductor device die where the second conductor includes a first region located nearer to the first semiconductor device die and a second region located nearer to the second semiconductor device die, forming the second conductor such that the first conductor includes a lower tensile strength in the first region than the second region, and forming a third conductor that electrically couples the first conductor to the second conductor at the ends of the first and second conductors in the second semiconductor device die. The second conductor is coupled to the metal layer and the second conductor ends in or near the seal ring of the second semiconductor device die.

In another aspect of the above embodiment the first semiconductor device die includes another metal layer of the one or more metal layers and the method further includes forming a second conductor extending from a side of the first semiconductor device die into the dicing lane and toward the second semiconductor device die where the second conductor includes a first region located nearer to the first semiconductor device die and a second region located nearer to the second semiconductor device die, forming the second conductor such that the first conductor includes a lower tensile strength in the first region than the second region, forming the second conductor such that the second conductors above the first conductor and approximately parallel to the first conductor and about the length of the first conductor, and forming a third conductor to electrically couple the first conductor to the second conductor at the end of the first and second conductors in the second semiconductor device die. The second conductors coupled to the other metal layer, the second conductor ends in or near the seal ring of the second semiconductor device die. In a further aspect, the third conductor is a metal-filled via.

In another aspect of the above embodiment, said forming the first conductor such that the first conductor includes a lower tensile strength in the first region than the second region further includes forming the first conductor to have a narrower width in the first region than in the second region. In a further aspect, said forming the first conductor to have a narrower width in the first region than in the second region further includes forming the first conductor to include a third region between the first and second regions where the third region has a width of approximately 0.3 µm, and forming the first region to have a width of about 0.256 µm.

In still another aspect of the above embodiment, said forming the first conductor further includes forming the second region of the first conductor to an approximate shape of an isosceles triangle. A base of the isosceles triangle is the end of the first conductor nearer to the second semiconductor device die. The base of the isosceles triangle is about three times a width of the first conductor in the first region. A tip of the isosceles triangle is subsumed within the first conductor toward the first region. In another aspect of the above embodiment, the method further includes etching wafer material from the dicing lane to perform plasma dicing of the first semiconductor device die from the second semiconductor device die, and subjecting the first conductor to a tensile force after said etching where the tensile force is sufficient to break the first conductor in the first region.

Another embodiment of the present invention provides a semiconductor device die having integrated circuitry implemented in one or more metal layers. The semiconductor device die includes a first conductor exposed within a recess formed in a first sidewall of the semiconductor device die, where the first conductor has a first width. The semiconductor device die includes a second conductor exposed at a surface of a second sidewall of the semiconductor device die opposite to the first sidewall. The second conductor has a second width that is larger than the first width. In one aspect of the above embodiment, the semiconductor device die further includes a third conductor exposed within another recess formed in the first sidewall of the semiconductor device die. In a further aspect, the first and third conductors are formed within a same metal layer of the semiconductor device die. In another further aspect, the first and third conductors are formed within different metal layers of the semiconductor device die.

Another embodiment of the present invention provides a semiconductor wafer having a plurality semiconductor device die arranged in a grid pattern. The semiconductor wafer includes a first semiconductor device die region including one or more metal layers and a second semiconductor device die region, neighboring the first semiconductor device die region in the grid pattern and separated from the first semiconductor device die region by a dicing lane. A first layer of the one or more metal layers of the first semiconductor device die region includes a first conductor extending from a side of the first semiconductor device die region into the dicing lane and extending toward the second semiconductor device die region, entering the second semiconductor device die region, and ending in or near a seal ring of the second semiconductor device die region. A second layer of the one or more metal layers of the first semiconductor device die region includes a second conductor extending from a side of the first semiconductor device die region into the dicing lane and extending toward the second semiconductor device die region, entering the second semiconductor device die region, and entering in or near a seal ring of the second semiconductor device die region. The first and second conductors are formed such that first regions of the first and second conductors have a lower tensile strength than second regions of the first and second conductors. The first regions of the first and second conductors are located in the dicing lane nearer to the first semiconductor device die region than the second semiconductor device die region. The second regions of the first and second conductors are located in the dicing lane nearer to the second semiconductor device die region than the first semiconductor device die region. The second conductor is approximately parallel to the first conductor.

In one aspect of the above embodiment, the first and second layers are a same layer of the one or more metal layers and the semiconductor wafer further includes a third conductor that couples ends of the first and second conductors in the second semiconductor device die region. In another aspect of the above embodiment, the first and second layers are different layers of the one or more metal layers and the semiconductor wafer further includes the second conductor located over and above the first conductor, and a metal filled via electrically coupling the first and second conductors in the second semiconductor device die region. In still another aspect of the above embodiment, the first and second layers are different layers of the one or more metal layers and the semiconductor wafer further includes a third conductor formed in the semiconductor device die region, and metal-filled vias coupling the third conductor to each of the first and second conductors.

The above structures and methods of making those structures provide a mechanism to reduce shorting of severed saw bow conductors subsequent to singulation of device die from a wafer. By reducing the tensile strength of the conductors in a region close to the device die from which the saw bow extends, breakage can more predictably occur in an area protected by insulating material, thereby preventing conductive material from causing a short between the remnants of the saw bow conductors.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is further noted that the term "neighboring" as used herein means "adjacent to" (e.g., next to and without an intervening object), and "laterally" as used herein means "in a sideways direction" (e.g., a horizontal direction that is parallel to a plane of the substrate).

As used herein, the terms "approximately" and "about" mean a value close to or within an acceptable range of an indicated value, amount, or quantity, which also includes the exact indicated value itself.

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, the shape of the conductive legs of the saw bow are not limited to those shapes illustrated in the figures, but instead should be sufficient to reduce the tensile strength of the conductors in the region desired for breaking. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor wafer having a plurality of semiconductor device die arranged in a grid pattern, the semiconductor wafer comprising:
   a first semiconductor device die;
   a second semiconductor device die, neighboring the first semiconductor device die in the grid pattern and separated from the first semiconductor device die by a dicing lane; and
   a first conductor extending from a side of the first semiconductor device die into the dicing lane and extending toward the second semiconductor device die, entering the second semiconductor device die, and ending within a seal ring region of the second semiconductor device die, wherein the first conductor is formed such that a first region of the first conductor located nearer to the first semiconductor device die in the dicing lane has a lower tensile strength than a second region of the first conductor located in the dicing lane nearer to the second semiconductor device die.

2. The semiconductor wafer of claim 1 further comprising:
   a second conductor extending from the side of the first semiconductor device die into the dicing lane and extending toward the second semiconductor device die, entering the second semiconductor device die, and ending within the seal ring region of the second semiconductor device die, wherein
      the second conductor is formed such that a first region of the second conductor located nearer to the first semiconductor device die has a lower tensile strength than a second region of the second conductor located nearer to the second semiconductor device die, and
      the second conductor is parallel to the first conductor; and
   a third conductor that electrically couples the first conductor to the second conductor at the ends of the first and second conductors within the seal ring region of the second semiconductor device die.

3. The semiconductor wafer of claim 2, wherein a distance between the first conductor and the second conductor is 2 µm.

4. The semiconductor wafer of claim 2 wherein the first and second conductors are within a same metal layer of one or more metal layers implemented on the semiconductor wafer.

5. The semiconductor wafer of claim 2, wherein
   the first and second conductors are within different metal layers of one or more metal layers implemented on the semiconductor wafer, and
   the second conductor is located above the first conductor.

6. The semiconductor wafer of claim 1 wherein the first conductor is formed such that the first region of the first conductor has a lower tensile strength than the second region of the first conductor by virtue of the first conductor having a narrower width in the first region than the second region.

7. The semiconductor wafer of claim 6, wherein
   the first conductor comprises a third region between the first and second regions,
   the third region has a width that is less than that of the second region, and
   the first region has a width of 85% or less than that of the third region.

8. The semiconductor wafer of claim 1, wherein the first conductor is formed such that the first region of the first conductor has a lower tensile strength than the second region of the first conductor by virtue of
- the second region of the first conductor comprising an approximate shape of an isosceles triangle,
- a base of the isosceles triangle is the end of the first conductor nearer to the second semiconductor device die,
- the base of the isosceles triangle is approximately three times a width of the first conductor in the first region, and
- a tip of the isosceles triangle is subsumed within the first conductor toward the first region.

9. A method of providing a saw bow to a semiconductor device die on a wafer, the method comprising:
- forming integrated circuitry within one or more metal layers on a wafer, wherein
  - the integrated circuitry is arranged in a grid pattern of a plurality of device die regions including a first semiconductor device die region and a second semiconductor device die region, and
  - the first semiconductor device die region is separated from the second semiconductor device die region by a dicing lane; and
- forming a first conductor extending from a side of the first semiconductor device die region into the dicing lane and toward the second semiconductor device die region, wherein
  - the first conductor is coupled to a metal layer of the one or more metal layers,
  - the first conductor ends within a seal ring region of the second semiconductor device die region,
  - the first conductor comprises a first region located in the dicing lane nearer to the first semiconductor device die region and a second region located in the dicing lane nearer to the second semiconductor device die region, and
  - the first conductor comprises a lower tensile strength in the first region than the second region.

10. The method of claim 9 further comprising:
forming a second conductor extending from a side of the first semiconductor device die region into the dicing lane and toward the second semiconductor device die region, wherein
- the second conductor is coupled to the metal layer,
- the second conductor ends within the seal ring of the second semiconductor device die region,
- the second conductor comprises a first region located nearer to the first semiconductor device die region and a second region located nearer to the second semiconductor device die region;
- the second conductor comprises a lower tensile strength in the first region than the second region; and
- forming a third conductor to electrically couple the first conductor to the second conductor at the ends of the first and second conductors in the seal ring of the second semiconductor device die region.

11. The method of claim 9, wherein the first semiconductor device die region comprises another metal layer of the one or more metal layers, the method further comprising:
forming a second conductor extending from a side of the first semiconductor device die region into the dicing lane and toward the second semiconductor device die region, wherein
- the second conductor is coupled to the other metal layer,
- the second conductor ends in or near the seal ring of the second semiconductor device die region,
- the second conductor comprises a first region located nearer to the first semiconductor device die and a second region located nearer to the second semiconductor device die,
- the second conductor comprises a lower tensile strength in the first region than the second region;
- the second conductor is above the first conductor and approximately parallel to the first conductor and about the length of the first conductor; and
- forming a third conductor to electrically couple the first conductor to the second conductor in the seal ring of the second semiconductor device die region.

12. The method of claim 11, wherein the third conductor is a metal-filled via.

13. The method of claim 9 wherein said forming the first conductor such that the first conductor comprises a lower tensile strength in the first region than the second region further comprises:
forming the first conductor to have a narrower width in the first region than in the second region.

14. The method of claim 9 further comprising:
etching wafer material from the dicing lane to perform plasma dicing of the first semiconductor device die from the second semiconductor device die region; and
subjecting the first conductor to a tensile force after said etching, wherein the tensile force is sufficient to break the first conductor in the first region.

15. The method of claim 14, wherein the first conductor forms at least a part of a conductive pathway to test circuitry formed within the first semiconductor device die region and the conductive pathway is eliminated upon the breaking of the first conductor.

* * * * *